United States Patent [19]
Lee et al.

[11] Patent Number: 6,028,876
[45] Date of Patent: Feb. 22, 2000

[54] HIGH POWER SEMICONDUCTOR LASER DEVICE AND METHOD FOR FABRICATING THE SAME

[75] Inventors: Jung Kee Lee; Kyung Hyun Park, both of Daejeon; Ho Sung Cho, Pusan; Dong Hoon Jang; Chul Soon Park, both of Daejeon, all of Rep. of Korea

[73] Assignees: Electronics and Telecommunications Research Institute, Daejeon; Korea Telecom, Seoul, both of Rep. of Korea

[21] Appl. No.: 08/976,014

[22] Filed: Nov. 21, 1997

[30] Foreign Application Priority Data

Dec. 7, 1996 [KR] Rep. of Korea ............ 96-62713

[51] Int. Cl.[7] ............................................. H01S 3/19
[52] U.S. Cl. ........................... 372/46; 372/23; 372/45; 372/50; 437/129
[58] Field of Search ............................ 372/23, 45, 46, 372/50; 437/129

[56] References Cited

U.S. PATENT DOCUMENTS

| | | | |
|---|---|---|---|
| 4,727,557 | 2/1988 | Burnham et al. | 372/50 |
| 5,043,291 | 8/1991 | Devoldere et al. | 437/24 |
| 5,160,492 | 11/1992 | Wang et al. | 437/22 |
| 5,193,098 | 3/1993 | Welch et al. | 372/46 |
| 5,504,768 | 4/1996 | Park et al. | 372/46 |

OTHER PUBLICATIONS

James Guthrie et al., "Beam Instability in 980–nm Power Lasers: Experiment and Analysis", IEEE Photonics Technology Letters, vol. 6, No. 12, Dec. 1994, pp. 1409–1411.

*Primary Examiner*—Rodney Bovernick
*Assistant Examiner*—Sung T. Kim
*Attorney, Agent, or Firm*—Jacobson, Price, Holman & Stern, PLLC

[57] ABSTRACT

The present invention relates to high power semiconductor laser device and method for fabricating the same utilizing ion implanting process, by which a beam steering phenomenon of an optical output due to filaments is eliminated. This elimination is achieved by a periodically varying gain given for a resonator of the semiconductor laser device. That is, this invention changes a gain distribution which causes the generation of filaments in the resonator into different distribution. According to the present invention, there is formed an insulation layer through ion implantation to an active layer to adjust current density implanted to the active layer, thereby eliminating non-uniform distribution of the light along the longitudinal direction of the resonator.

10 Claims, 6 Drawing Sheets

HIGH POWER SEMICONDUCTOR LASER DEVICE AND METHOD FOR FABRICATING THE SAME

BACKGROUND OF THE INVENTION

1. Field of the Invention

The present invention relates to high power semiconductor laser device used for a light source of an Erbium Doped Fiber Amplifier (EDFA) and, more particularly to high power semiconductor laser device and method for fabricating the same utilizing ion implanting process.

2. Description of the Conventional Art

A semiconductor laser at a 0.98 micro-meter wavelength is used as a light source for the Erbium Doped Fiber Amplifier EDFA for amplifying an optical signal passing through an optical fiber. As an optical output from the above-mentioned semiconductor laser is increased, a light amplifying rate of EDFA becomes higher accordingly. To this end, it is highly demanded to fabricate the 0.98 micro-meter semiconductor laser, which is capable of providing high power output. Especially, it should be apparent that the semiconductor laser for use in the EDFA is required to further improve its optical output, and an optical coupling efficiency between the semiconductor laser and an optical fiber coupled thereto has to be improved for use in module. There has been greatly improved the powerful and reliable 0.98 micro-meter semiconductor laser and the high optical coupling efficiency between the high power semiconductor laser and the optical fiber.

A desired 0.98 micro-meter semiconductor laser module may be made through the coupling of high power semiconductor laser to the optical fiber. However, patterns (emission patterns) of optical output emitted from the semiconductor laser constituting the module are varied depending upon varying operation conditions for the semiconductor laser. This causes an amount of light introduced into the optical fiber to be instantly attenuated, resulting in the deteriorated performance of the semiconductor laser module.

Figure 1:
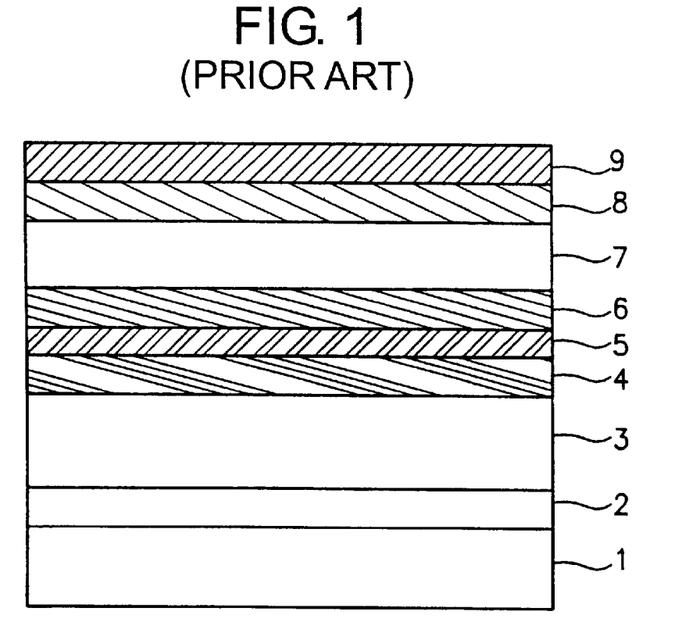
FIG. 1 is a sectional view of a structure after a first crystal growth for fabricating a conventional high power laser device.
Figure 2:
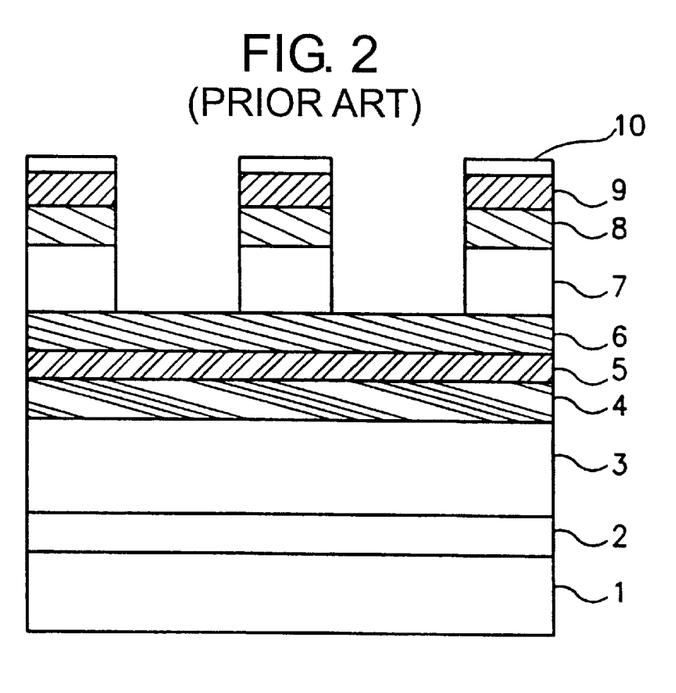
FIG. 2 is a sectional view of a structure after photolithography process for fabricating the conventional ridge waveguide (RWG) semiconductor laser device.
Figure 3:
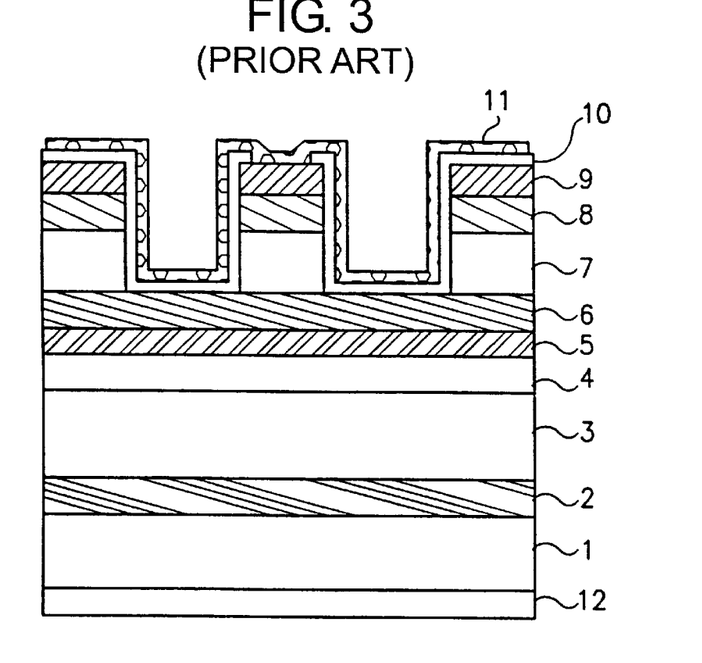
FIG. 3 is a sectional view of a structure after fabricating the conventional RWG semiconductor laser device.

FIGS. 1 to 3 illustrate steps in the fabrication of a conventional 0.98 micro-meter ridge waveguide semiconductor laser device.

FIG. 1 schematically shows a sectional view of the structure consisting, in sequence, of a compound semiconductor substrate 1, a GaInAsP graded layer 2 for further assisting electric current flow caused by band gap difference between GaAs and GaInP layers on the substrate 1, a GaInP clad layer 3, a GaInAsP graded layer 4, a GaInAs/GaInAsP active layer 5, a GaInAsP graded layer 6, a GaInP clad layer 7, a GaInAsP graded layer 8, and a GaAs layer 9 for an ohmic contact. These layers have been grown by Metal Organic Vapor Phase Epitaxy (MOVPE).

Then, as shown in FIG. 2, an insulation layer 10 of $SiO_2$ or $Si_3N_4$ is formed over the resultant specimen of FIG. 2, followed by a well-known photolithography process. This process leaves an insulation layer 10 with the active layer having a constant width of 2 to 3 micro-meters. Sequentially, wet etching or dry chemical etching process is further performed until a top surface of the GaInAsP graded layer 6 is exposed, so that ridges are made as shown in FIG. 2. In FIG. 2, the insulation layer 10 is removed through an appropriate etching process, followed by the formation of another insulation layer 10 of $Si_3N_4$ or $SiO_2$ over the whole surface of the resulting structure. Then, electric current injection window is made to the ridge so as to inject electric current through the ridges. The injection is made through the deposited, plated p-side electrode 11 having a thickness of 2 to 3 micro-meters and which can withstand high current. After thinning the substrate until the thickness of an order of 100 micro-meters is obtained, an n-side electrode 12 is formed, by which the conventional 0.98 micro-meter RWG semiconductor layer is completed.

In case electric current is injected into the conventional semiconductor laser fabricated through steps as described above, current injection is made through ridges within a cavity having width of 2 to 3 micro-meter and length of 800 to 1000 micro-meter. Therefore, only the active layer 5 under the ridge can provide an optical gain, by which light is emitted. There are difference between the refractive indices of respective layers arranged in a vertical direction relative to the active layer 5, wherein the indices get smaller in order of the active layer 5, graded layers 6, 4 and clad layers 7, 3. Further, the difference between the effective refractive index of area under the ridge and index of other area except said area exists, as seen in horizontal direction relative to the active layer 5. With these differences, the light emitted by the above-mentioned gain can be collected around the active layer.

The active layer employed in the RWG semiconductor layer is configured depending upon both gain-guided and index-guided waveguiding properties. When injecting electric current, the active layer of a rectangular stripe shape having been formed through etching process is slightly enlarged in the horizontal direction by current spreading. A length of the active layer corresponds to that of the cavity for the RWG semiconductor laser, while the rectangular width is slightly larger than that of the ridge. In order to provide high output power from the 0.98 micro-meter semiconductor laser, width of the ridge is given as large as possible within a range wherein a sectional area (rectangle) of the active layer is sized to maintain a single lateral mode. The effects of significant lateral spatial hole burning combined with waveguides inherently sensitive to perturbations by injected carriers are manifested in the widespread observation that as they are driven to higher currents, most high power lasers eventually lase on multiple lateral modes. This broken condition causes filament having width of 1 micro-meter and length of 100 to 150 micro-meter to be generated at random. The generation of such filaments is due to the attenuation of a fundamental lateral mode caused by the spatial hole burning phenomenon, and is further due to oscillation of higher-order lateral mode which has higher gain at a side along the cavity axis of the active layer. Lasing mode field pattern of the optical output from the semiconductor laser becomes varied accordingly.

The central axle of emission pattern in the fundamental lateral mode is consistent with that of the cavity. However, in case the filaments occur at side along the cavity axis of the active layer, a beam steering phenomenon is induced which the central axle of emission pattern is deviated from the axle of the cavity to a side opposed to the generated filament. The 0.98 micro-meter semiconductor laser module to which the optical fiber optically aligned under the fundamental lateral mode operation is attached intends to induce varying amount of the light to be coupled to the optical fiber, because of the beam steering phenomenon due to the generated filament. This makes maximum optical output varied and deteriorates the stability of the optical output, resulting in the reduction of performance of the semiconductor laser module.

In other words, injection of high current to the conventional semiconductor laser as mentioned above causes the fundamental lateral mode to be attenuated due to the spatial hole burning. On the other hand, under the above condition, higher-order lateral mode obtains high gain at a side along the cavity axis of the active layer. For these reasons, filaments of 1 micro-meter in width are generated at random. Such filaments causes emission pattern of an optical output at the output surface to be varied. Although width of the active layer may be narrowed to eliminate such a phenomenon, the narrowed active layer provides the low optical power and readily induces damage to the optical output surface.

SUMMARY OF THE INVENTION

In relation to those problems as mentioned above, the present invention is to eliminate the beam steering phenomenon due to filaments generated when the conventional high power laser is operated under high injected current. For this object, the present invention performs selectively ion implantation to a clad layer over an active layer to adjust current density to be implanted in a longitudinal direction of the active layer and to thereby eliminate non-uniform distribution of the light along the longitudinal direction of the cavity.

To achieve the above objects, there is provided high power semiconductor laser comprising: a compound semiconductor substrate; a first graded layer, a first clad layer, a second graded layer, an active layer, a third graded layer and a second clad layer sequentially formed on said substrate by using a first crystal growth; ion-implanted regions formed in said second clad layer, wherein the ion-implanted regions are electrically isolated through high temperature annealing so as to allow gain along a longitudinal of the active layer to be modulated with the same period as the ion-implanted period; a third clad layer, a fourth graded layer and ohmic contact layer sequentially formed on the second clad layer having the ion-implanted regions by using a second crystal growth, wherein these layers are etched until the third graded layer is exposed in order to form a ridge waveguide structure; an insulation layer having current injection window in some portion of top area of the ridge; a first conductivity electrode formed over the entire surface of the insulation layer; and a second conductivity electrode formed on the rear surface of the substrate.

To achieve the another objects of the present invention, there is also provided a method fabricating high power laser, the method comprising the steps of: a first crystal growing for forming a first graded layer, a first clad layer, a second graded layer, an active layer, a third graded layer and a second clad layer on a compound semiconductor substrate; forming a first insulation pattern on the second clad layer to define ion-implanted regions by photolithography; implanting ions by using the first insulation pattern as a mask, and annealing, so that said ion-implanted regions allow gain along a longitudinal direction of the active layer to be modulated with same period as ion-implanted period; a second crystal growing for sequentially forming a third clad layer, a fourth graded layer and an ohmic contact layer on the second clad layer having ion-implanted regions; forming a second insulation pattern having a width a little wider than that of the ion-implanted regions; sequentially etching using the second insulation pattern as a mask until the third graded layer is exposed, to form a ridge waveguide structure; forming an insulation layer having a current injection window in some portion of top area of the ridge; forming a first conductivity electrode formed over the entire surface of the insulation layer; and forming a second conductivity electrode formed on the rear surface of the substrate.

Preferably, depth of said ion-implanted regions is defined to reach the top of the active layer so as to prevent any increasing loss of the active layer, and has a 10 micro-meters long length along the resonator's length and width a little wider than that of the active layer, such shaped regions being sequentially arranged at an interval of 5 to 10 micro-meters.

More preferably, before said annealing, further comprising the steps of: removing the first insulation pattern; and forming a silicon nitride film on both top and rear surface of the resultant structure, to protect the surface degradation during annealing process.

BRIEF DESCRIPTION OF THE DRAWINGS

The present invention will become more fully understood to following detailed description taken in conjunction with the accompanying drawings, wherein.

DETAILED DESCRIPTION OF THE INVENTION

The preferred embodiment according to the present invention will now be described in detail in accordance with the accompanying drawings.

This invention provides a new 0.98 micro-meter semiconductor laser device by which the beam steering phenomenon induced by filaments is eliminated.

The object of the present invention can be accomplished by a periodic gain adjustment relating to a cavity of the semiconductor laser. Such elimination is possible in that a continuous gain distribution needed to generate filaments in the resonator is changed in its shape in accordance with the present invention.

Implementation of gain adjustment for the 0.98 micrometer semiconductor laser can be achieved through a preferred embodiment of the present invention given below. The preferred embodiment according to the present invention will be explained in detail with reference to FIGS. 4 to 8.

Figure 4:
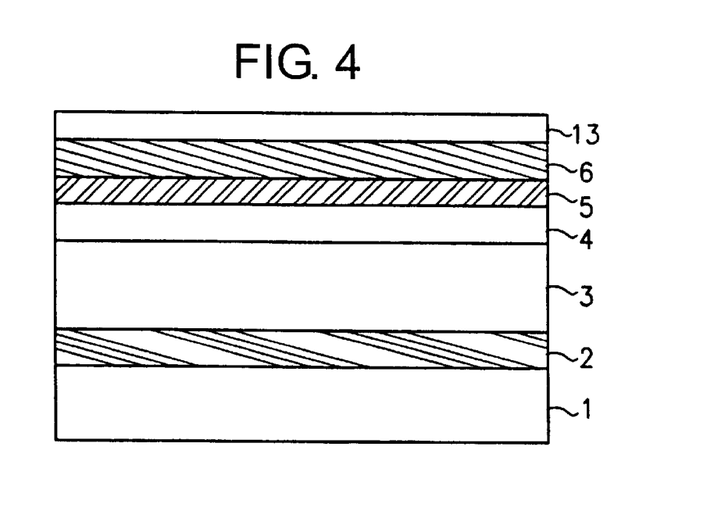
FIG. 4 is a sectional view of a structure after a first crystal growth for fabricating high power laser device in accordance with the present invention.

FIG. 4 shows a sectional view of the structure consisting of a compound semiconductor substrate 1, a GaInAsP graded layer 2 for further assisting electric current flow caused by band gap difference between GaAs and GaInP layer on the substrate 1, a GaInP clad layer 3, a GaInAsP graded layer 4, a GaInAs/GaInAsP active layer 5, a GaInP graded layer 6, and 0.5 micro-meter thick GaInP clad layer 13, these layers being obtained through the epitaxial growth process using Metal Organic Vapor Phase Epitaxy (MOVPE) as first crystal growth process.

Figure 5A:
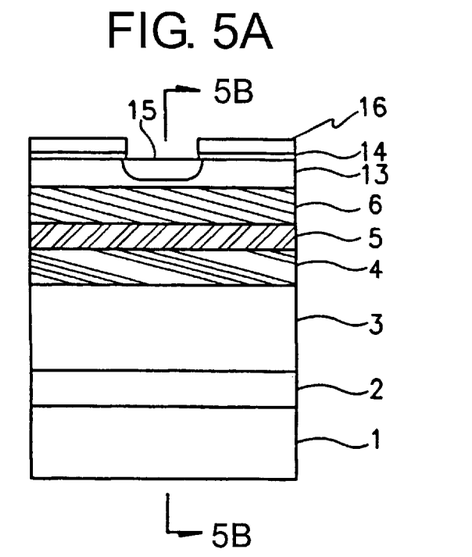
FIG. 5 is sectional and side views of a structure after ion implanting process for fabricating a stable high power semiconductor laser device in accordance with the present invention.
Figure 5B:
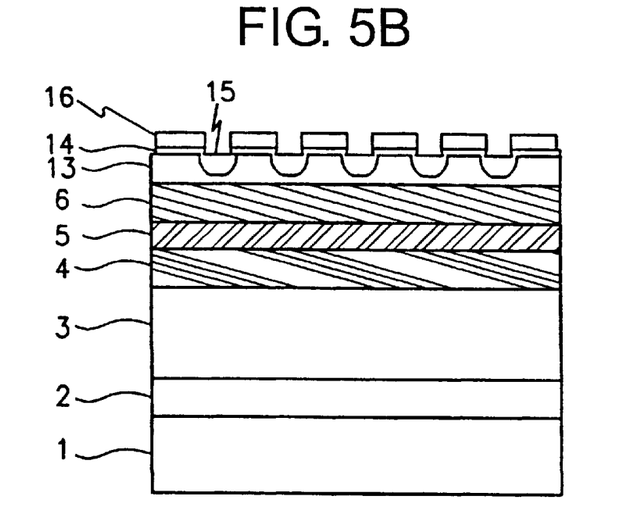

Then, as shown in FIG. 5, an insulation layer 14 of $SiO_2$ or $Si_3N_4$ is formed over the resultant specimen of FIG. 4, followed by a well-known photolithography process for patterning. This patterning process is applied to the insulation layer 14, and then leaves the patterned insulation layers 14 which are isolated by 5 to 20 micrometer, respectively, each pattern having length of the order of 10 micro-meters in the longitudinal direction of the cavity and width a little wider than that of the active layer. Side sectional view of the resultant structure is shown in FIG. 5. Using the patterned insulation layers 14 and photoresist film 16 as a mask, ions of B+, Ar+, Si+, or He+ are implanted towards the structure, followed by the removal of the used mask.

Next, in order to electrically isolate ion-implanted regions 15, an insulation layer of $Si_3N_4$ is formed on both surface and rear of the structure, and then annealing is performed at the temperature of 600 to 950° C. for several seconds. It is noted that the ion-implanted regions may be adjusted at a constant ratio, so that the depth of implantation is defined to reach the top of the GaInAsP graded layer. This is because it is likely to induce an increase any loss of the active layer, in case the ion implantation is made till the active layer.

Figure 6A:
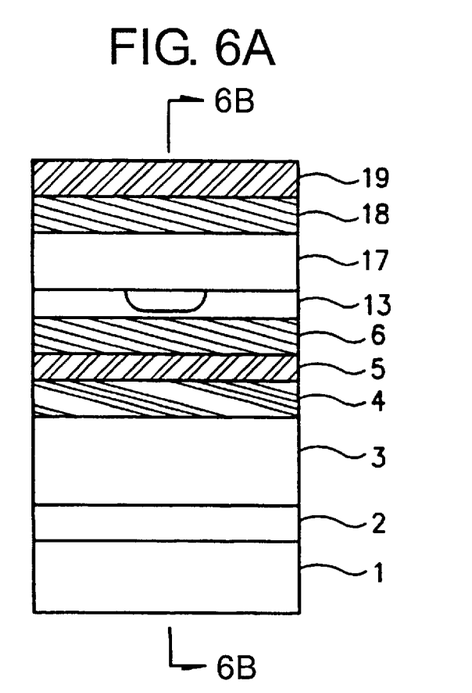
FIG. 6 is sectional and side views of a structure after a second crystal growth in accordance with the present invention.
Figure 6B:
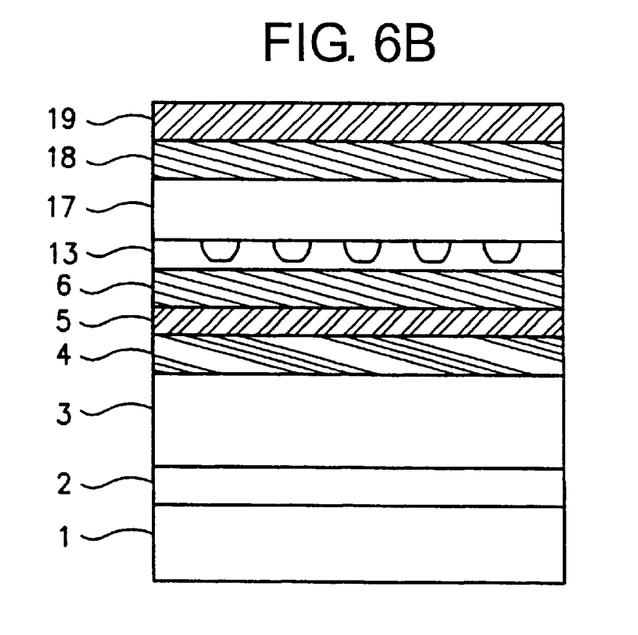

After the removal of the insulation layer used to protect the surface degradation during annealing process, the second crystal growing is performed. By the second crystal growing, as shown in FIG. 6, a GaInP clad layer 17, a GaInAsP graded layer 18, and a GaAs layer 19 for ohmic contact are sequentially grown.

Figure 7A:
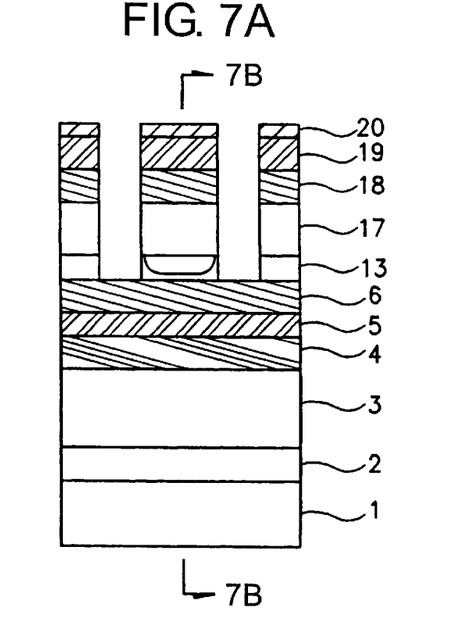
FIG. 7 is side and sectional views of a structure after photolithography process for fabricating the ridge waveguide RWG semiconductor laser device in accordance with the present invention.
Figure 7B:
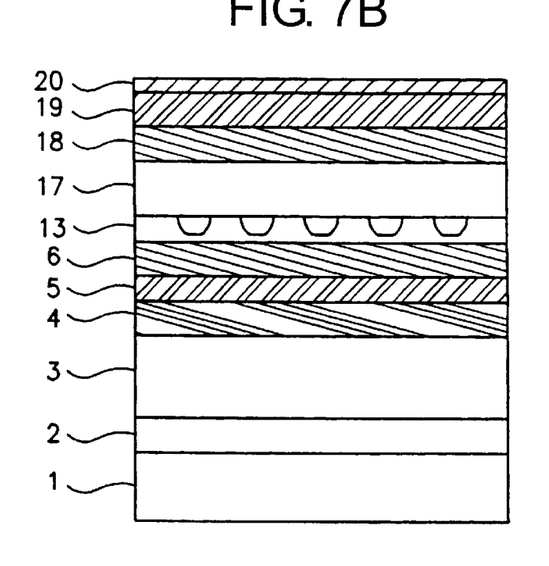

Referring to FIG. 7, the insulation layer 20 is patterned through the photolithographic process, with 2 to 3 micrometers width of the actively layer maintained. The patterned insulating layer 20 is used as a mask for subsequent wet or dry etching process. The etching process is conducted until the GaInAsP graded layer 6 is revealed. Thus, the demanded ridge is obtained from the above-described processes.

The following sequential processes are further performed so as to be inject electric current into the ridges thus constructed above. To this end, the insulation layer 20 as shown in FIG. 7 is removed, and then another insulation layer 21 of $Si_3N_4$ or $SiO_2$ is formed over the whole surface of the structure. A top area of the ridge having the insulation layer provided thereon has electric current injection window provided through an appropriate window forming process. Subsequently, a p-side electrode 22 is deposited, and then is subjected to plating process for obtaining 2 to 3 micro-meter thick electrode 22, the thickness of which ensures that the structure withstands injected high current.

Figure 8A:
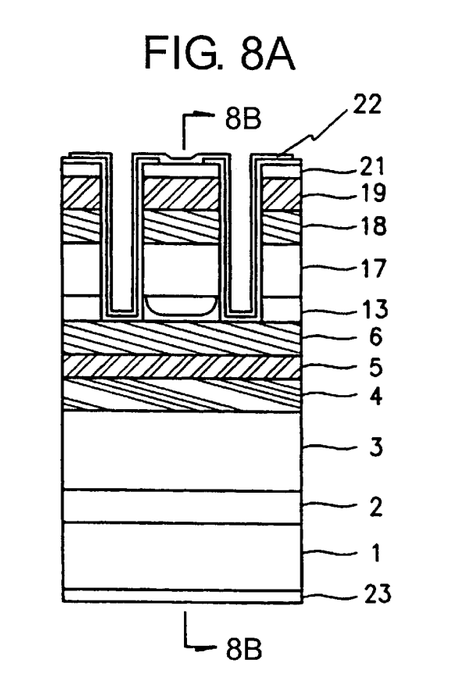
FIG. 8 is side and sectional views of the RWG semiconductor laser device completed in accordance with the present invention.
Figure 8B:
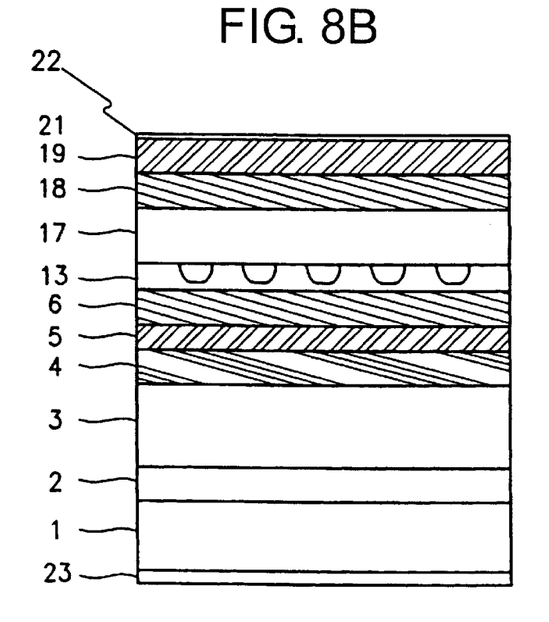

In order to obtain an 100 micro-meters thick substrate, thinning process is applied to the structure, followed by the formation of an n-side electrode 23. Thus, as shown in FIG. 8, a 0.98 micro-meters ridge waveguide semiconductor laser in accordance with the present invention is completed.

In comparison to the conventional semiconductor laser device, a feature of the semiconductor laser device of the present invention is that gain modulation along a longitudinal direction of the active layer is made with the same period as ion-implantation period. This is because gain of the active layer is determined by an amount of injected electric charges. Gain distribution along the longitudinal direction of the active layer causes modulation of distribution of light inside the cavity, so that any generation of filaments, which are otherwise presented more than 100 micro-meters in its length along the resonator, is essentially eliminated.

Gain period, i.e., the ion-implanted area and non-implanted area along the longitudinal direction of the resonator is defined by the following requirements.

Maximum value of the modulation period should be smaller than minimum length of filament generating in a longitudinal direction of the cavity, and, on the other hand, minimum value of the modulation period should be larger than diffusion length of electric charges which are injected through the non-implanted area, in case of gain modulation by the ion-implanted area.

During the forming of an anti-reflection coating film on a front output surface and high-reflection coating film on a rear output surface, these processes being required in fabricating a general semiconductor laser device, light inside the resonator shows a smooth distribution, rather than uniform distribution.

A preferred example to which the present invention is applied under said circumstances is as follows. Intensity of the modulation and period adjustment may be accomplished by controlling in proportional to light distribution an interval between the ion-implanted areas. For the purpose of eliminating non-uniform distribution of the light in a longitudinal direction of the resonator, electric current density injected into the active layer is adjusted. The preferred embodiment of the present invention can be applied to either some or general length of the resonator, regardless of gain or lateral mode distribution modulation and modulation intensity and period of the modulation. In case the preferred embodiment is applied the general length of the resonator, the modulation forms a standing wave with respect to both front and rear output surfaces. Further, it should be apparent that the preferred embodiment can be also applied to high power semiconductor laser devices at different wavelengths, as well as the 0.98 micro-meters semiconductor laser and 1.48 micro-meters devices which are used as an excitation light source for optical fiber amplifying units.

An ion implantation process is employed so as to ensure a stable optical output through an adjustment of electric current injected into the active layer. In accordance with the present invention, an insulation layer is formed through the thermal treatment after implanting ions towards some portions of the clad layer overlying the active layer. Such ion-implanted areas allow gain modulation along a longitudinal direction of the active layer to be made with the same period as ion-implantation period. This is because gain of the active layer is determined by an amount of injected electric charges. Gain distribution along the longitudinal direction of the active layer causes modulation of distribution of light inside the resonator, so that any filament generation of more than 100 micro-meters in its length along the resonator is essentially eliminated.

As described above, the present invention eliminates beam steering phenomenon relating to an optical output due to filaments essentially generating from high power semiconductor laser. When one fabricates module including semiconductor laser device coupled to the optical fiber, it can be expected to have maximum optical output of the module, and to have features of a stable optical output regardless of operation conditions for the semiconductor laser device.

While the present invention has been described with respect to certain preferred embodiment only, other modifications and variations may be made without departing from the scope of the present invention as set forth in the following claims.

What is claimed is:

1. High power semiconductor laser device comprising:
   a compound semiconductor substrate;
   a first graded layer, a first clad layer, a second graded layer, an active layer, a third graded layer and a second clad layer sequentially formed on said substrate by using a first crystal growth;
   ion-implanted regions formed in said second clad layer, wherein the ion-implanted regions are electrically isolated through high temperature annealing so as to allow gain along a longitudinal of the active layer to be modulated with the same period as the ion-implanted period;
   a third clad layer, a fourth graded layer and ohmic contact layer sequentially formed on the second clad layer having the ion-implanted regions by using a second crystal growth, wherein these layers are etched until the third graded layer is exposed in order to form a ridge waveguide structure;
   an insulation layer having current injection window in some portion of top area of the ridge;
   a first conductivity electrode formed over the entire surface of the insulation layer; and
   a second conductivity electrode formed on the rear surface of the substrate.

2. The device as defined in claim 1, wherein depth of said ion-implanted regions is defined to reach the top of the active layer so as to prevent any increasing loss of the active layer, and has a 10 micro-meters long length along the resonator's length and width a little wider than that of the active layer, such shaped regions being sequentially arranged at an interval of 5 to 10 micro-meters.

3. The device as defined in claim 1, wherein said ion comprises one selected among B, Ar, Si and He.

4. The device as defined in claim 1, wherein said high temperature annealing is performed at the temperature range of 600 to 950° C. for several seconds.

5. A method fabricating high power semiconductor laser device, the method comprising the steps of:
   (a) a first crystal growing for forming a first graded layer, a first clad layer, a second graded layer, an active layer, a third graded layer and a second clad layer on a compound semiconductor substrate;
   (b) forming a first insulation pattern on the second clad layer to define ion-implanted regions by photolithography;
   (c) implanting ions by using the first insulation pattern as a mask, and annealing, so that said ion-implanted regions allow gain along a longitudinal direction of the active layer to be modulated with same period as ion-implanted period;
   (d) a second crystal growing for sequentially forming a third clad layer, a fourth graded layer and an ohmic contact layer on the second clad layer having ion-implanted regions;
   (e) forming a second insulation pattern having a width a little wider than that of the ion-implanted regions;
   (f) sequentially etching using the second insulation pattern as a mask until the third graded layer is exposed, to form a ridge waveguide structure;
   (g) forming an insulation layer having a current injection window in some portion of top area of the ridge;
   (h) forming a first conductivity electrode formed over the entire surface of the insulation layer; and
   (i) forming a second conductivity electrode formed on the rear surface of the substrate.

6. The method as defined in claim 5, wherein depth of said ion-implanted regions is defined to reach the top of the active layer so as to prevent any increasing loss of the active layer, and has a 10 micro-meters long length along the resonator's length and width a little wider than that of the active layer, such shaped regions being sequentially arranged at an interval of 5 to 10 micro-meters.

7. The method as defined in claim 5, wherein said ion comprises one selected among B, Ar, Si and He.

8. The method as defined in claim 5, wherein said high temperature annealing is performed at the temperature range of 600 to 950° C. for several seconds.

9. The method as defined in claim 5, wherein before said annealing in step (c), further comprising the steps of:
   removing the first insulation pattern; and
   forming a silicon nitride film on both top and rear surface of the resultant structure, to protect the surface degradation during annealing process.

10. The method as defined in claim 5, wherein the step (i) further comprising, thinning the substrate to obtain thickness of the substrate of 100 micro-meters.

* * * * *